(12) United States Patent
Loyer

(10) Patent No.: US 7,127,363 B2
(45) Date of Patent: Oct. 24, 2006

(54) CALCULATING DIFFERENTIAL SCATTERING PARAMETERS

(75) Inventor: Jeff W. Loyer, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 10/833,239

(22) Filed: Apr. 27, 2004

(65) Prior Publication Data

US 2005/0240361 A1   Oct. 27, 2005

(51) Int. Cl.
*G06F 19/00* (2006.01)

(52) U.S. Cl. .......................... 702/57; 324/638; 702/66; 703/14

(58) Field of Classification Search ................ 702/57, 702/66, 104, 118, 189, 64; 324/76.19, 601, 324/638; 703/14
See application file for complete search history.

(56) References Cited

U.S. PATENT DOCUMENTS

| | | | | |
|---|---|---|---|---|
| 4,816,767 A | * | 3/1989 | Cannon et al. | ............. 324/601 |
| 5,025,402 A | * | 6/1991 | Winkelstein | ................. 703/14 |
| 6,653,848 B1 | * | 11/2003 | Adamian et al. | ........... 324/638 |

OTHER PUBLICATIONS

"Using Single-ended S-matrices to Characterize Differential Components in Mobile Radio Design". Lee, Sang Jin. www.rfdesign.com. RF signal processing, pp. 14-18. Apr. 1, 2003.
"On-wafer differential/multi-port characterization solution". http://www.cascademicrotech.com/pubs/DIFF-QA.pdf. Cascade Microtech Q&A, Jun. 2002.

* cited by examiner

*Primary Examiner*—Michael Nghiem
*Assistant Examiner*—John Le
(74) *Attorney, Agent, or Firm*—Trop, Pruner & Hu, P.C.

(57) ABSTRACT

In one embodiment, the present invention includes a method for simulating a first stimulus into a device under test and measuring first single-ended scattering parameters caused thereby, and directly calculating a differential scattering parameter from the first single-ended scattering parameters. In certain embodiments, second single-ended scattering parameters may be obtained from a second stimulus into the device under test, and the results used to calculate the differential scattering parameter, for example, where a device under test is non-homogeneous.

20 Claims, 4 Drawing Sheets

CALCULATING DIFFERENTIAL SCATTERING PARAMETERS

BACKGROUND

The present invention relates to characterizing components of a system, and more particularly to characterizing electrical networks using various parameters. As digital signals move to communication in gigahertz and gigabit ranges, interconnects become more important in enabling reliable system performance. Signal integrity issues such as reflection, crosstalk, frequency dependent transmission line loss, and the like can significantly degrade system performance and reliability. The ability to simulate and accurately predict the effect of such signal integrity issues is part of designing a system.

Network analyzers are used to characterize active and passive components. Such components may include interconnects, and these components can have one port (input or output) or many ports. The ability to measure the input characteristics of each port, and the transfer characteristics from one port to another gives a designer needed information. A vector network analyzer (VNA) is one type of network analyzer that can measure integrity issues over wide frequency ranges. VNAs are often used during design and manufacture to measure and display complete amplitude and phase characteristics of an electrical network (i.e., system components). These characteristics include scattering parameters (S-parameters), standing wave ratios (SWR), insertion loss or gain, delay return loss, reflection coefficient and the like.

While such VNAs and other network analyzers may be used during design, they are often expensive and difficult to use. Furthermore, such network analyzers require presence of actual devices. Accordingly, during a design phase, it is desirable to perform simulations similar to characterizations that may be done on network analyzers. Various computer programs exist to perform such simulations for characterizing electrical networks. Thus a designer will often use a simulation to test and determine characteristics of a proposed component before incorporation into a system.

Using such a simulation, a designer typically calculates a differential S-parameter by taking single-ended parameters and manually manipulating the single-ended parameters using appropriate mathematics to convert them into the differential parameter. For example, a designer will print real and imaginary portions of single-ended S-parameters, insert them into a spreadsheet or math program, perform appropriate mathematical functions and plot results as a function of frequency. However, there is no easy way to obtain differential parameters within a simulation program. Accordingly, a need exists to directly obtain differential parameters, particularly in a simulation program.

DETAILED DESCRIPTION

Scattering parameters are a set of parameters that describe the scattering and reflection of traveling waves when a stimulus is inserted into a device. S-parameters are typically used to characterize high frequency networks and may be characterized by magnitude, phase, and magnitude in decibels (dB). S-parameters may be considered to be a gain of a network and subscripts attached thereto may denote port numbers. For example, the ratio of an output of an output port to an incident wave into an input port, e.g., output of port 2 to input of port 1, may be designated as $S_{21}$. Mixed-mode S-parameters may measure a differential device's behavior in different conversion modes, such as differential mode signals and common mode signals. For example, a mixed mode S-parameter $S_{DC21}$ means an S-parameter characteristic of an output on port 2 to an input on port 1 and from common mode to differential mode.

Figure 1:
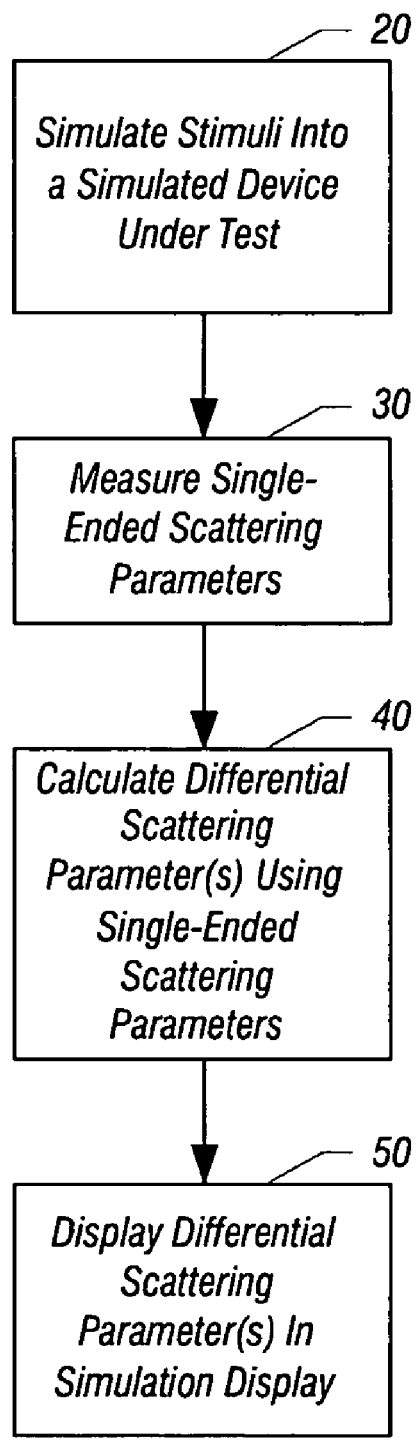
FIG. 1 is a flow diagram of a method in accordance with one embodiment of the present invention.

Referring now to FIG. 1, shown is a flow diagram of a method in accordance with one embodiment of the present invention. As shown in FIG. 1, method 10 may be used to perform a simulation to obtain scattering parameters of a simulated device under test.

Such a simulation may be performed during a design phase, when a device under test has not been fully designed or selected, but characteristics are desired for furthering the design process. While such a device under test (DUT) may vary in different embodiments, such a DUT may be any desired electrical network, such as any active or passive component that may be used in a system. For example, a DUT may be a set of transmission lines, connectors, interconnects, or any other device, such as an amplifier, filter, bus component or the like. Such simulations may be desirably performed by designers of a system to avoid the expense and burden of testing components using a network analyzer or the like. This is especially so, as proposed system elements may be modeled as a simulated DUT without requiring a physical device.

Still referring to FIG. 1, method 10 may begin by simulating one or more stimuli into a simulation device under test (block 20). For example, a simulated voltage signal may be applied to a simulation DUT. Such an excitation of the simulation DUT will cause various waves, which may be then measured. Specifically, these waves may be measured as single-ended scattering parameters (block 30). Such single-ended scattering parameters may include, for example, reflection coefficients of an input port and an output port, and forward and reverse transmission gains from input port to output port and output port to input port, respectively. In other embodiments, other scattering parameters or other signal integrity parameters may be collected.

In various embodiments, multiple simulated voltage sources may simulate voltages at appropriate nodes of a simulation DUT. For example, a first simulated stimulus (e.g., a first voltage source) may be input into a first port of the simulation DUT, and appropriate scattering parameters measured, and then a second stimulus (e.g., a second voltage source) may be input into a second port of the simulation DUT and appropriate S-parameters measured therefrom. Such multiple stimuli may particularly be used to obtain one or more differential scattering parameters.

However, in an embodiment in which a four-port network includes matched input ports having matched impedances, such multiple stimuli may not be needed, and a single set of single-ended S-parameters obtained from a single stimulus may be sufficient. Thus in certain embodiments, a simulation program may be adapted to query whether an arrangement for a device under test is matched or non-homogenous. If the DUT is non-homogenous, a simulation program may use at least two different stimuli provided on different ports. If instead it is determined that the DUT is matched, a single stimuli may be provided, in certain embodiments.

Next, one or more differential scattering parameters may be calculated using the single-ended scattering parameters (block 40). Finally, the differential scattering parameters may be displayed in a simulation display (block 50). In such manner, the differential scattering parameters may be directly measured, calculated, and displayed using a single-ended simulation program.

While a simulation program may vary in different embodiments, in one embodiment, a program written to be compatible with HSPICE, available from Synopsis, Inc., Mountain View, Calif. may be used. In another embodiment, a simulation program compatible Advanced Design System (ADS), available from Agilent Technologies, Palo Alto, Calif., may be used. Of course, other simulation programs may be used in other embodiments.

Figure 2:
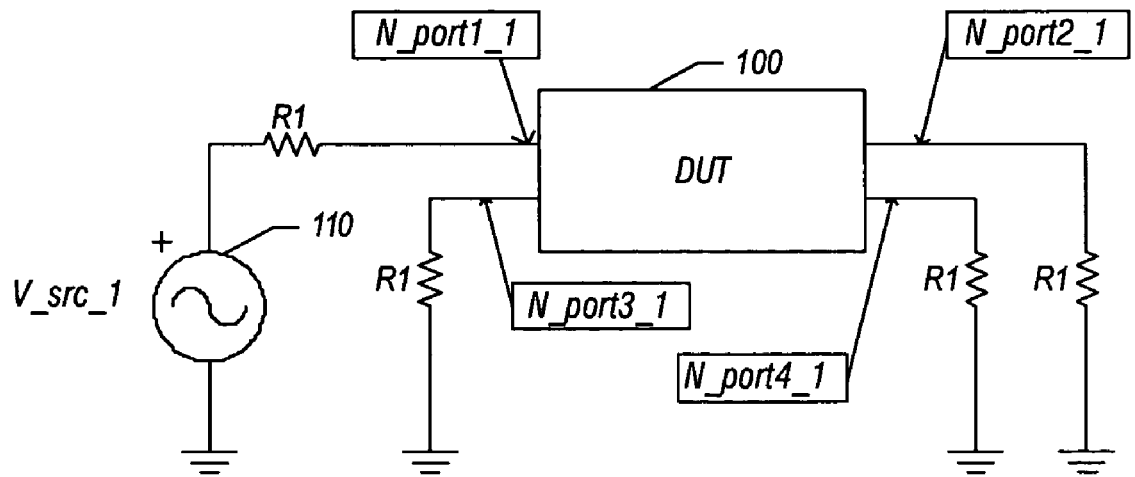
FIG. 2 is a block diagram of a first simulation circuit in accordance with an embodiment of the present invention.

Referring now to FIG. 2, shown is a block diagram of a simulation circuit in accordance with one embodiment of the present invention. As shown in FIG. 2, the simulation circuit may include a simulated DUT 100. As discussed above, DUT 100 may vary in different embodiments, but in certain embodiments may represent one or more transmission lines. For example, in one embodiment, such a transmission line may be a differential interconnect used within a computer system, for example, a high-speed serial data bus interconnection that may be used with a desired communication protocol, such as a common system interface (CSI) protocol. In other embodiments, such a high-speed serial interconnect may be used for a Peripheral Component Interconnect (PCI) Express™ protocol in accordance with the PCI Express Base Specification, version 1.0a (published July 2002).

As shown in FIG. 2, the simulation circuit may include a voltage source (VS) 110 that may be used to simulate an input voltage into DUT 100. In one embodiment, VS 110 may be a two volt alternating current (AC) signal, although the scope of the present invention is not so limited. As shown in FIG. 2, VS 110 may be referred to as V_src_1. As shown in FIG. 2, DUT 100 may be a two-port differential device having input ports 1 and 3 and output ports 2 and 4. Note that in the embodiment shown in FIG. 2, the first port may bear the nomenclature N_port1_1; port two may be termed N_port2_1; port three may be termed N_port3_1; and port 4 may be termed N_port4_1. These designations for the ports thus indicate the value of a signal at the given port in light of a stimulus entering input port 1. While shown for simplicity in FIG. 2 as being a two-port device, it is to be understood that in other embodiments a DUT may have multiple ports greater than two.

The simulation circuit of FIG. 2 may be used during a first portion of a simulation program to simulate excitation of DUT 100 with VS 110. With such an excitation, single-ended S-parameters may be measured at each port of DUT 100, namely the first port (i.e., $S_{11}$); the second port (i.e., $S_{21}$); the third port (i.e., $S_{31}$); and the fourth port (i.e., $S_{41}$). As shown in FIG. 1, each port of DUT 100 may be terminated using an equally valued resistor R1 which, in certain embodiments, may be 50 ohms (Ω). The scattering parameters calculated using the simulation circuit of FIG. 2 may be stored for later use in a simulation program.

Figure 3:
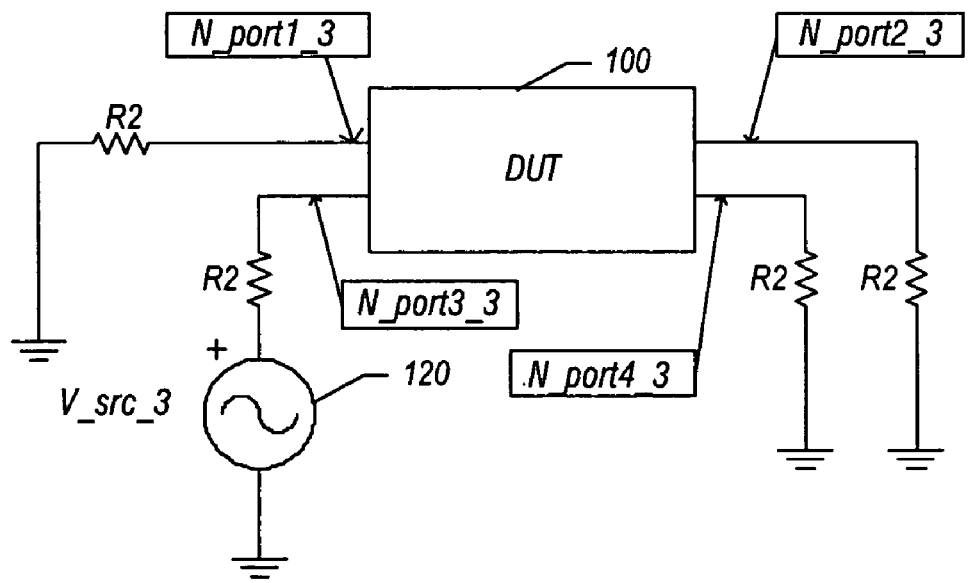
FIG. 3 is a block diagram of a second simulation circuit in accordance with an embodiment of the present invention.

Referring now to FIG. 3, shown is a block diagram of a second simulation circuit in accordance with an embodiment of the present invention. As shown in FIG. 3, DUT 100 may be the same as the DUT of FIG. 2, and a different simulated stimulus may instead be connected to input port 3. Specifically, shown in FIG. 3, a VS 120 (i.e., V_src_3) may be used to simulate input of a second voltage into DUT 100. In one embodiment, VS 120 may provide a two volt AC signal, although the scope of the present invention is not so limited. As described above, the ports shown in FIG. 3 may be designated N_port1_3; N_port2_1; N_port3_1, and N_port4_1, indicating their relation to the simulation stimulus at the input port 3. During execution of the simulation program, single-ended S-parameters may be calculated for each of the four ports, namely the first port (i.e., $S_{31}$); the second port (i.e., $S_{23}$); the third port (i.e., $S_{33}$); and the fourth port (i.e., $S_{43}$). These single-ended scattering parameters may also be stored for later use in the simulation.

Figure 4:
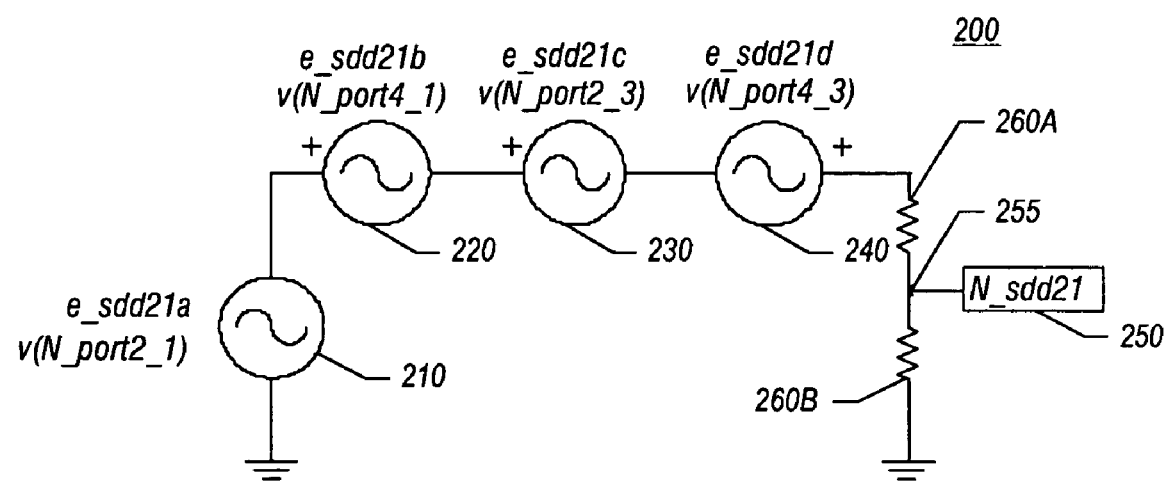
FIG. 4 is a block diagram of a simulation measurement circuit in accordance with one embodiment of the present invention.

Referring now to FIG. 4, shown is a block diagram of a simulation measurement circuit in accordance with one embodiment of the present invention. As shown in FIG. 4, simulation circuit 200 may include a plurality of voltage controlled voltage sources (VCVSs) used to represent single-ended scattering parameters of various ports of a device under test. Specifically, as shown in FIG. 4, a first VCVS 210 is coupled in series to a second VCVS 220, which in turn is coupled to a third VCVS 230, which is in turn itself coupled to a fourth VCVS 240. Further shown in FIG. 4, a differential S-parameter 250 (N_sdd$_{21}$) may be calculated by analysis of the voltage at a node 255 between first and second resistors of a voltage divider formed from resistors 260A and 260B. In the embodiment of FIG. 4, resistors 260a and b may each be one ohm resistors, although the scope of the present invention is not so limited.

Each of the VCVSs shown in FIG. 4 may simulate S-parameters existing at output ports two and four of DUT 100 caused by the excitations of the voltage sources shown in FIGS. 1 and 2. More specifically, VCVS 210 may represent S-parameter $S_{21}$ existing at output port two (i.e., N_port2_1) based on the simulation stimulus shown in FIG. 1; VCVS 220 may represent S-parameter $S_4$, existing at output port four (i.e., N_port4_1) based on the excitation of input port one shown in FIG. 1; VCVS 230 may represent S-parameter $S_{23}$ existing at output port 2 (i.e., N_port2_3) based on the input stimulus of FIG. 3; and VCVS 40 may represent S-parameter $S_{43}$ existing at the fourth output port (i.e., N_port4_3) based on the input stimulation shown in FIG. 3.

Thus as shown in FIG. 4, simulation circuit 200 performs the following calculation to obtain the value existing at node 255:

$$S_{DD21} = \frac{1}{2}(S_{21} - S_{41} - S_{23} + S_{43}) \qquad [1]$$

where $S_{DD21}$ is a differential to differential insertion loss from input port 1 to output port 2. In such manner, a differential scattering parameter for a differential insertion loss may be directly calculated in a simulation program. It is to be understood that in other embodiments, other differential S-parameters may be calculated using a different circuit that includes simulation components to obtain desired single-ended S-parameters. For example, other differential S-parameters may be determined by appropriately connecting a plurality of simulation VCVSs to properly add or subtract voltages to obtain the desired differential S-parameter.

Referring now to Table 1 below, shown is code for a simulation program in accordance with one embodiment of the present invention. The code of Table 1 may be used to directly calculate a differential insertion loss from a plurality of single-ended S-parameters obtained using the simulation measurement circuit of FIG. 4.

TABLE 1

```
sdd21_example
.AC Lin 800 30K 20G
.subckt myTline p1_in     n1_in
+       p1_out    n1_out
W_myTline_coupled p1_in n1_in 0
+       p1_out n1_out 0
+       RLGCfile=../rlc/sdd21_example.rlc N=2 L=10
.ends myTline
**** Stimulus at port1
V_src_1 N_src_1 0 DC=0 ac 2 $ 0VDC, 2VAC
(will get divided by 2 by source R)
R_src_1 N_src_1 N_port1_1 R=50
R_load_port2_1 N_port2_1 0 R=50
R_load_port3_1 N_port3_1 0 R=50
R_load_port4_1 N_port4_1 0 R=50
X_Tline_1 N_port1_1      N_port3_1
+       N_port2_1   N_port4_1
+       myTline
**** Stimulus at port3
V_src_3 N_src_3 0 DC=0 ac 2 $ 0VDC, 2VAC (will get
divided by 2 by source R)
R_src_3 N_src_3 N_port3_3 R=50
R_load_port1_3 N_port1_3 0 R=50
R_load_port2_3 N_port2_3 0 R=50
R_load_port4_3 N_port4_3 0 R=50
X_Tline_3 N_port1_3      N_port3_3
+       N_port2_3   N_port4_3
+       myTline
**** SDD21 = 1/2 (S21 − S41 − S23 + S43)
e_sdd21a N_sdd21a 0      N_port2_1 0 1 $ copy S21
e_sdd21b N_sdd21a N_sdd21b N_port4_1 0 1 $ subtract S41
e_sdd21c N_sdd21b N_sdd21c N_port2_3 0 1 $ subtract S23
e_sdd21d N_sdd21d N_sdd21c N_port4_3 0 1 $ add S43
r_sdd21a N_sdd21d N_sdd21 R=1 $ divide result by 2
r_sdd21b N_sdd21 0 R=1
.print vm(N_sdd21) vp(N_sdd21) vdb(N_sdd21)
.END
```

As shown in Table 1, simulated stimuli are input into ports 1 and 3 (as shown above with respect to FIG. 2 and FIG. 3). Then $S_{DD21}$ may be determined in accordance with the simulation circuit shown in FIG. 4.

Specifically, referring to Table 1 in more detail, the program is set up to perform an alternating current (AC) sweep from 30 kilohertz (KHz) to 20 gigahertz (GHz) at 800 different points. Then a device under test is defined. As shown in Table 1, such a device may be a lossy transmission line, although the scope of the present invention is not so limited.

Next, as shown in Table 1, a simulated stimulus may be provided at port 1. Specifically, in the code beginning after the comment line "Stimulus at port 1", a simulated voltage source of two volts AC may be input into the DUT at port 1. Further shown, each port is terminated with a 50 ohm load. Scattering parameters are thus obtained at the various ports for the simulated stimulus on port 1. This portion of the code thus simulates the circuit shown in FIG. 2. Next, a similar simulated stimulus is input into port three (at the lines following the comment "Stimulus at port 3") and S-parameters obtained.

The final portion of the code of Table 1 performs a simulation of the circuit shown in FIG. 4 and accordingly determines differential S-parameter $S_{DD21}$ in accordance with equation [1] set forth above. It is to be understood that while equation [1] is derived from simulation circuit 200, in other embodiments, where different loads are present, a different voltage divider exists, or alternately, different differential parameters are desired to be obtained, a different equation (and a different simulation circuit) and different code may be used.

Still referring to Table 1, using the print statement (.print) at the second to last line of the code, the differential S-parameter may be directly displayed in a graphical user interface (GUI) of a simulation program. Specifically, magnitude, phase, and magnitude in decibels (dB) may be displayed.

In such manner, simulations of high-speed differential interconnect components may be performed to directly extract differential S-parameters. Such parameters may then be used to compare the "goodness" of the components and correlate simulation results directly to VNA measurements of the same parameters.

Embodiments may be implemented in code and may be stored on a storage medium having stored thereon instructions which can be used to program a computer system to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs), erasable programmable read-only memories (EPROMs), flash memories, electrically erasable programmable read-only memories (EEPROMs), magnetic or optical cards, or any type of media suitable for storing electronic instructions.

Figure 5:
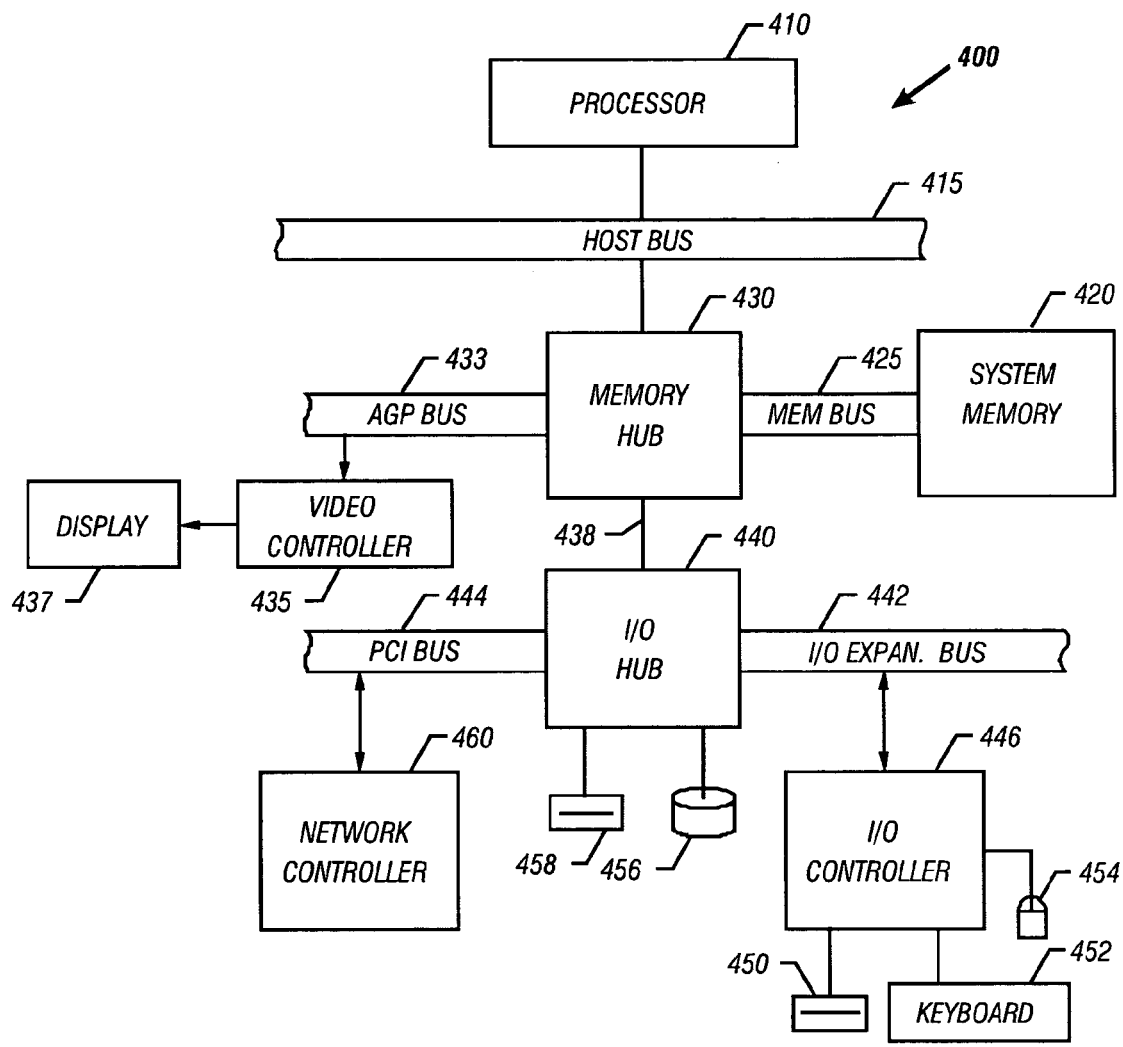
FIG. 5 is a block diagram of a system with which embodiments of the present invention may be used.

Example embodiments may be implemented in software for execution by a suitable computer system configured with a suitable combination of hardware devices. FIG. 5 is a block diagram of computer system 400 with which embodiments of the invention may be used.

Now referring to FIG. 5, in one embodiment, computer system 400 includes a processor 410, which may include a general-purpose or special-purpose processor such as a microprocessor, microcontroller, a programmable gate array (PGA), and the like. As used herein, the term "computer system" may refer to any type of processor-based system, such as a desktop computer, a server computer, a workstation computer, a laptop computer, or the like.

The processor 410 may be coupled over a host bus 415 to a memory hub 430 in one embodiment, which may be coupled to a system memory 420 via a memory bus 425. The memory hub 430 may also be coupled over an Advanced Graphics Port (AGP) bus 433 to a video controller 435, which may be coupled to a display 437. The AGP bus 433 may conform to the Accelerated Graphics Port Interface Specification, Revision 2.0, published May 4, 1998, by Intel Corporation, Santa Clara, Calif.

The memory hub 430 may also be coupled (via a hub link 438) to an input/output (I/O) hub 440 that is coupled to a input/output (I/O) expansion bus 442 and a Peripheral Component Interconnect (PCI) bus 444, as defined by the PCI Local Bus Specification, Production Version, Revision 2.1 dated June 1995. The I/O expansion bus 442 may be coupled to an I/O controller 446 that controls access to one or more I/O devices. As shown in FIG. 5, these devices may include in one embodiment storage devices, such as a floppy disk drive 450 and input devices, such as keyboard 452 and mouse 454. The I/O hub 440 may also be coupled to, for example, a hard disk drive 456 and a compact disc (CD) drive 458, as shown in FIG. 5. It is to be understood that other storage media may also be included in the system.

The PCI bus 444 may also be coupled to various components including, for example, a network controller 460 that is coupled to a network port (not shown). Additional devices may be coupled to the I/O expansion bus 442 and the PCI bus 444, such as an input/output control circuit coupled to a parallel port, serial port, a non-volatile memory, and the like.

Although the description makes reference to specific components of the system 400, it is contemplated that numerous modifications and variations of the described and illustrated embodiments may be possible. More so, while FIG. 5 shows a block diagram of a system such as a personal computer, it is to be understood that embodiments of the present invention may be implemented in a server or workstation environment.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    directly calculating in a simulation a differential scattering parameter of a device under test solely from a plurality of single-ended scattering parameters according to a simulation circuit of the device under test using a plurality of transmission parameters obtained from a first stimulus and a second stimulus, via adding a first transmission parameter from the first stimulus and a first transmission parameter from the second stimulus and subtracting a second transmission parameter from the first stimulus and a second transmission parameter from the second stimulus, the simulation circuit comprising a plurality of voltage controlled voltage source; and
    storing the differential scattering parameter for later use in the simulation.

2. The method of claim 1, wherein the simulation circuit comprises a string of series-coupled voltage controlled voltage sources having an output coupled to a voltage divider.

3. The method of claim 1, wherein the first stimulus and the second stimulus comprise simulated voltage sources.

4. The method of claim 1, wherein the differential scattering parameter relates to a simulated differential interconnect under test.

5. The method of claim 4, wherein the simulated differential interconnect comprises a serial data interconnect.

6. The method of claim 1, further comprising displaying the differential scattering parameter on a display.

7. The method of claim 1, further comprising:
    obtaining a user input regarding whether the device under test includes matched input ports; and
    providing the first and second stimulus if the device under test does not include the matched input ports otherwise, only providing the first stimulus.

8. The method of claim 1, wherein the simulation comprises a single-ended simulation program.

9. A method comprising:
    obtaining a user input regarding whether a simulation device under test includes matched input ports;
    simulating a first stimulus into the simulation device under test and measuring first single-ended scattering parameters caused thereby;
    simulating a second stimulus into the simulation device under test and measuring second single-ended scattering parameters caused thereby if the simulation device under test does not include the matched input ports;
    directly calculating a differential scattering parameter from at least the first single-ended scattering parameters; and
    outputting the differential scattering parameter to the user.

10. The method of claim 9, further comprising directly calculating the differential scattering parameter from the first single-ended scattering parameters and the second single-ended scattering parameters.

11. The method of claim 9, wherein outputting the differential scattering parameter comprises displaying the differential scattering parameter.

12. The method of claim 9, further comprising directly calculating the differential scattering parameter using simulated voltage controlled voltage sources.

13. The method of claim 9, wherein the differential scattering parameter relates to a simulated serial data interconnect.

14. An article comprising a machine-accessible storage medium containing instructions that if executed enable a system to:
    directly calculate in a simulation a differential scattering parameter of a device under test solely from a plurality of single-ended scattering parameters according to a simulation circuit for the device under test using a plurality of transmission parameters obtained from a first stimulus and a second stimulus, via addition of a first transmission parameter from the first stimulus and a first transmission parameter from the second stimulus and subtraction of a second transmission parameter from the first stimulus and a second transmission parameter from the second stimulus to obtain the differential scattering parameter, the simulation circuit comprising a plurality of voltage controlled voltage sources; and
    store the differential scattering parameter in the system for later use in the simulation.

15. The article of claim 14, further comprising instructions that if executed enable the system to provide the second stimulus if the device under test is non-homogenous.

16. The article of claim 14, further comprising instructions that if executed enable the system to display the differential scattering parameter on a display.

17. A system comprising:
    a processor; and
    a dynamic random access memory coupled to the processor including instructions that if executed enable the system to calculate a simulated differential scattering parameter solely from a plurality of simulated single-ended scattering parameters of a simulation circuit for a device under test using a plurality of transmission parameters obtained from a first stimulus and a second stimulus, via addition of a first transmission parameter from the first stimulus and a first transmission parameter from the second stimulus and subtraction of a second transmission parameter from the first stimulus and a second transmission parameter from the second stimulus to obtain the simulated differential scattering parameter the simulation circuit comprising a plurality of series-coupled voltage sources each representative of one of the plurality of simulated single-ended scattering parameters obtained at an output port of the device under test, and to output the simulated differential scattering parameter from the system.

18. The system of claim 17, wherein the dynamic random access memory further comprises instructions that if executed enable the system to simulate the second stimulus into the device under test if the device under test is non-homogenous.

19. The system of claim 17, wherein the dynamic random access memory further comprises instructions that if executed enable the system to display the simulated differential scattering parameter on a display.

20. The system of claim 17, wherein the first stimulus and the second stimulus comprise simulated voltage controlled voltage sources.

* * * * *

UNITED STATES PATENT AND TRADEMARK OFFICE
CERTIFICATE OF CORRECTION

PATENT NO.        : 7,127,363 B2                                         Page 1 of 1
APPLICATION NO.   : 10/833239
DATED             : October 24, 2006
INVENTOR(S)       : Jeff W. Loyer It is certified that error appears in the above-identified patent and that said Letters Patent is hereby corrected as shown below:

Column 7:
Line 33, "source" should be --sources--.

Signed and Sealed this

Ninth Day of January, 2007

JON W. DUDAS
*Director of the United States Patent and Trademark Office*